Jan. 27, 1970 W. C. ROSVOLD 3,492,546

CONTACT FOR SEMICONDUCTOR DEVICE

Filed July 27, 1964

INVENTOR
WARREN C. ROSVOLD

BY [signature]
AGENT

United States Patent Office 3,492,546
Patented Jan. 27, 1970

3,492,546
CONTACT FOR SEMICONDUCTOR DEVICE

Warren C. Rosvold, Sunnyvale, Calif., assignor to Raytheon Company, Lexington, Mass., a corporation of Delaware Filed July 27, 1964, Ser. No. 385,400
Int. Cl. H01l 3/00, 5/00, 7/16
U.S. Cl. 317—234 2 Claims

ABSTRACT OF THE DISCLOSURE

An ohmic contact to P-type silicon is made with a partially alloyed aluminum layer and overlayer of silver. An ohmic contact to N-type silicon is made with a partially alloyed antimony layer and an overlayer of silver. At elevated temperatures the silver combines with the unalloyed aluminum or antimony before further alloying into the silicon can occur. A method of plating on the silver using an A-C supply is also disclosed.

The present invention relates to semiconductors and more particularly to the ohmic contacts formed on semiconductors to provide electrical communication with an external circuit.

In terms of process, the invention relates to the use of the bipolar characteristics of semiconductor junctions to plate ohmic contacts to semiconductor devices. In terms of apparatus, the invention comprises a raised ohmic contact adhered to a semiconductor device, and a preferred embodiment comprises a silver contact plated upon an aluminum alloyed portion of a p-type conductivity region of a silicon semiconductor device. The physical size of the contact is sufficient to facilitate automatic handling, orientation and establishment of electrical connection of the semiconductor devices in external circuits. Moreover, the contacts are formed with a minimum amount of metal and without requiring the use of any special masks other than those already used in the fabrication of semiconductor devices.

The term "junction" as used herein in respect to the present invention is defined as—a region of transition between semiconducting regions of different electrical properties—which definition was established by IRE standards in the October 1954 issue of the "Proceedings of the IRE."

The term "bipolar electroforming" as used herein refers to applicant's newly discovered process of plating which makes use of a junction's rectifying properties to facilitate the formation of a raised metal contact adjacent the junction. For purposes of illustration, the process is outlined for the formation of an anode contact on a PN diode, although it is not limited to this alone. First, all but a selected portion of the surface of the P-type conductivity material is masked by $SiO_2$ or like material. Next, contact is made between the back (cathode) side of the diode and an AC voltage supply. The voltage is of a symmetrical waveform, such as 60-cycle AC. The diode is then placed in an electroforming bath of a desired metal and a completed electrical circuit is formed in a well known manner by inserting the opposing pole of the voltage supply in the electroforming bath. During that portion of the cycle when the diode is negative, the metal will plate onto all portions of the diode which are not masked. In the case of a planar diode much of the diode will be masked by $SiO_2$ but anode areas, the edges, and certain imperfections in the $SiO_2$ layer will plate. During the negative half of the cycle, all areas except the anode area will deplate. This is because the anode area, due to the rectifying property of the junction, will not pass the deplating current. This last effect is what is meant by bipolar electroforming. The result is an anode contact whose properties are determined by the plating solution and rate of current.

This process can be used to plate metal directly upon the semiconductor material or upon a thin layer of metal which has been deposited previously by some other method, such as, but not limited to, vacuum deposition. Preferably, the selected portion of the semiconductor body is first prepared by the deposition of a thin film of metal followed by heating to form an alloy of the deposited thin metal film and the semiconductor material in the selected portion. It is still further preferred that this alloying process be incomplete i.e. that a thin film of "free" metal be left on said alloyed film to insure good electrical bonding with the later plated electrical contact.

An additional property of this process is that defective junctions will deplate and, therefore, will not develop contacts. This permits a rapid, visual detection of electrically defective diodes which results in an economical testing procedure.

A still further modification can be obtained by adjusting the peak of the deplating voltage to a value equal to the minimum rating voltage of the diode type being manufactured. In this way, all diodes having a breakdown voltage lower than that desired will not have anode contacts and, again, a visual inspection can replace a more complicated electrical test.

In the prior art, metallic contacts on silicon semiconductor devices, both planar and nonplanar, have been the limiting factor wtih regard to high temperaure encapsulation and storage thereof. Indeed, it was a specific object of U.S. Patent No. 2,985,550 which issued to R. E. Anderson on May 23, 1961, entitled "Production of High Temperature Alloy Semiconductors," to ". . . provide an alloyed junction diode which is capable of being efficiently operated at ambient temperatures up to 150° C. and a method for making same." However the state of the art has now advanced to such an extent that even greater temperatures are required. For example, military specifications for semiconductor devices commonly require efficient operation over temperatures ranging from −65° C. to +200° C.

A basic problem in achieving satisfactory operation at and beyond the aforementioned high temperatures results from the thermal instability of the metallic contact on diffused junction areas of silicon devices. That is, the metal or combination of metals contacting the diffused area tends to form stable alloys with the silicon and achieve metallurgical equilibrium when subjected to long-term storage at high temperatures, e.g. 200° C. The same effect occurs when very high temperature encapsulation is used, such as glass to metal sealing.

In preparing the semiconductor device for an ohmic contact it is desirable to have incomplete alloying, i.e., to have a layer of unalloyed metal on metal-silicon alloy. This "free" metal can then be bonded to an electrical contact. However, since the volume of metal used is far greater than that necessary to completely alloy through and destroy the junction (if allowed to achieve metallurgical equilibrium) it is not possible to store or encapsulate the device at or above the alloying temperatures.

Various approaches have been attempted to insure operability of the device at temperatures at least as high as 200° C. For example, it has been suggested that a layer of metal such as chromium be interposed between a P-type silicon semiconductor and an electrical contact, such as gold. However this solution poses inherent difficulties in that chromium is not truly compatible with P-type silicon. That is to say, chromium is not nearly as good an acceptor as is P-type silicon and therefore the chromium silicon interface presents an electrical gradient rather than a truly ohmic contact.

The present invention provides a high temperature contact with a negligible electrical gradient. Furthermore, the electrical contact of the instant invention not only operates up to 150° C., it can be stored at 550° C. indefinitely. And the apparatus of the present invention does not create the aforementioned undesirable electrical gradient.

A prior method of forming these ohmic contacts to semiconductor devices consisted of alloying a contact to the semiconductor material. This was a quite critical process, particularly when the junction was located close to the surface, in that the depth of the alloying had to be severely limited to prevent junction damage. Another common practice was to make contact to a thin metal layer, alloyed to the semiconductor device, by the technique known as thermo-compression bonding. The present inventive method provides a strong metallic bond without the danger of excess alloying and yet is considerably more simple and economical to form than the thermo-compression bond.

It is therefore an important object of the present invention to provide an ohmic contact for a semiconductor device.

A further object of the invention is to provide an ohmic contact that is operable at relatively high temperatures e.g., 200° C.

Yet another objet of the present invention is to provide a relatively simple but precise method of manufacturing ohmic contacts on semiconductor devices.

Other objects and advantages of the presnt invention will become apparent by consideration of the following description, taken in conjunction with the accompanying drawings, in which.

Figure 1:
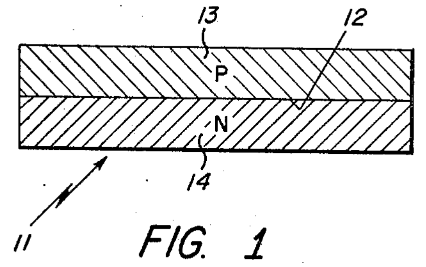
FIG. 1 shows a sectional view of a semiconductor device having P-type and N-type regions of conductivity.

Referring to FIG. 1, there is shown a semiconductor body or diode 11 of suitable material such as silicon or germanium comprising a junction 12 which separates a region of P-type conductivity material 13 from a region of N-type conductivity material 14. This semiconducting diode may be manufactured by a variety of means, such as the process disclosed in U.S. Patent N. 3,025,589 which issued to J. A. Hoerni on Mar. 20, 1962, entitled "Method of Manufacturing Semiconductor Devices." Although the instant inventive process will be illustrated with reference to a diode-type semiconductor body 11, it is within the scope of applicant's process that various semiconductor devices, including transistors, could also be utilized.

Figure 2:
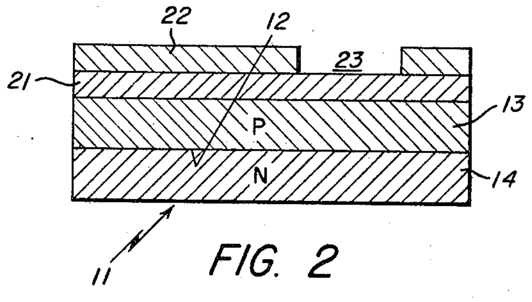
FIG. 2 shows the semiconductor device of FIG. 1 after having been partially oxidized.

FIG. 2 shows semiconductor body 11 after the surface of P-type conductivity material 13 has been covered with a protective coating 21, such as an oxide layer, which rejects metal plating. The xoide layer can be formed by any conventional well known oxidizing technique. Thereafter a layer of photo-resist material 22 is deposited by conventional techniques on the oxide layer in a pattern to leave an opening 23 where the oxide layer on the top surface is exposed. The photoresist material is one of the conventional photosensitive organic substances used in the photoengarving trade to form "resist images." Such materials are made insoluble by exposure to ultraviolet light and are described in numerous literary references, such as U.S. Patent Nos. 2,670,287; 2,690,966; 2,691,585; and 2,725,372.

The photoresist material 22 on the top surface of semiconductor body 11 may be provided with the opening 23 by exposing the layer 22 to ultarviolet light through a film negative having a desired pattern so that no light reaches the area where the open space 23 is to be provided. The part of the photoresist coating protected from light by the dark part of the film is soluble and is dissolved away by a suitable liquid which does not dissolve the part of the coating exposed to the light. This results in the pattern shown in the photoresist layer of FIG. 2.

Figure 3:
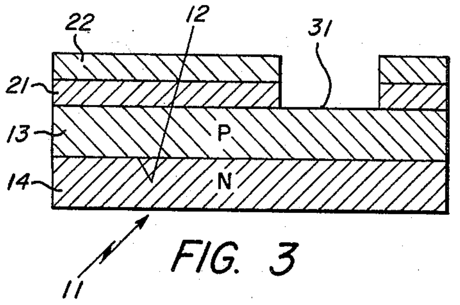
FIG. 3 illustrates the device of FIG. 2 wherein a portion of the oxidized layer has been etched away.

Thereafter, the assembly shown in FIG. 2 is emersed in a conventional etching solution which etches away the portion of the oxide layer which is exposed through opening 23, but does not attack the photoresist layer which was exposed to light nor the underlying oxide. As shown in FIG. 3, this leaves exposed a selected portion 31 on the surface of P-type conductivity material 13.

It is to be noted that the afore-described method of forming open space 23 in coating 21 is by way of illustration only. A variety of techniques known to the art of manufacturing semiconductor devices may be employed without departing from the spirit of the present invention.

Figure 4:
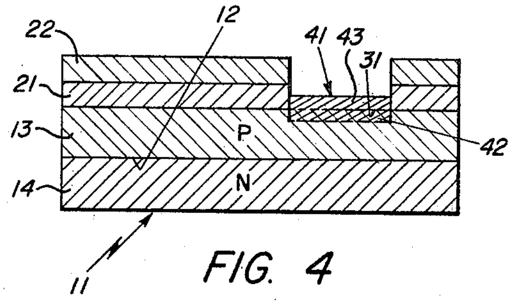
FIG. 4 illustrates the device of FIG. 3 upon a portion of which aluminum metal has been adhered.

As shown in FIG. 4, a layer 41 of aluminum metal is next deposited upon exposed portion 31 of P-type conductivity material by any of several well known processes, such as by evaporation. Preferably the deposited aluminum layer 41 is 1 to 1.5 microns deep. As further shown in FIG. 4, the aluminum metal is partially alloyed into semiconductor body 11 to form an aluminum-semiconductor alloy layer or region 42, preferably aluminum-silicon, and a layer or region of "free" i.e. unalloyed aluminum 43. This partial alloying operation is accomplished by maintaining the semiconductor body at about 610° C. in a nitrogen environment for about 10 minutes.

Figure 5:
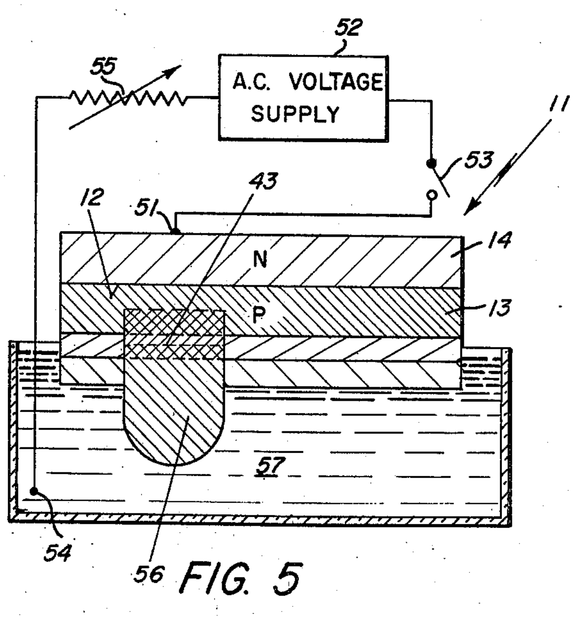
FIG. 5 depicts a concluding stage in the process of manufacturing ohmic contacts on a semiconductor device in accordance with this invention.

FIG. 5 illustrates a concluding operation in the present process. Electrical contact 51 is affixed to the surface of N-type conductivity material 14. This contact provides electrical communication between semiconductor body 11 and alternating current voltage supply 52 through switch 53. Thereafter, the semiconductor body is emersed in an electroforming bath 57 which has the following preferred composition:

| | | |
|---|---|---|
| Silver cyanide | grams per gallon | 168 |
| Potassium cyanide | do | 476 |
| Potassium carbonate | do | 84 |
| Deionized water | gallon | 1 |

In addition to the foregoing, it has been found that about 230 ml./gallon of brightner enhances the properties of the contact. The brightner promotes adherence of the silver to the aluminum and minimizes the inclusion of such solvents as water and silver ions. Detailed information on brightners is found in the 1960 edition of "Metal Finishing Guidebook Directory," pages 292–425.

Figure 6:
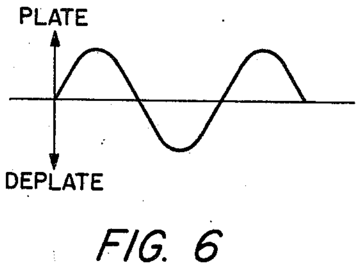
FIG. 6 depicts a typical waveform employed in the plating process of the present invention.

The opposing electrical contact 54 from voltage supply 52 is also inserted in electroforming bath 57 and switch 53 is closed so that an alternating voltage is applied across semiconductor body 11. The degree of plating-deplating current, a graph of which is depicted in FIG. 6, is controlled by means of variable resistor 55. In this manner the aforementioned bipolar effect of the junction 12 is utilized to plate a silver anode 56 of the desired size upon the free aluminum layer 43.

While a particular electroforming bath has been set forth, the present invention contemplates all electroforming baths common to the art of electroplating. These include baths of a myriad of metals such as nickel, chromium, etc.

The aforementioned operations comprise a process for manufacturing high temperature contacts for semiconductor devices. Preferably the contacts thus formed comprise an aluminum substrate alloyed with the P-type conductivity portion of a semiconductor device and upon which there is a raised silver contact. This contact, as mentioned before, has a free (unalloyed) aluminum interface between the raised silver contact and the aluminum silicon alloy. This contact differs greatly from those of the prior art in that, when it is reheated to the aluminum-silicon alloying temperature and above, there is no further appreciable alloying or diffusing of the contact into the junction area. The reason for this is that the raised silver contact has alloyed with the free aluminum (eutectic at 566° C.) before the free aluminum could further alloy with the silicon (eutectic at 577° C.).

At temperatures above 566° C., the alloying of the newly formed silver-aluminum eutectic layer with the aluminum-silicon eutectic layer and free silicon proceeds very slowly since there is a great volume of silver available to be dissolved by the aluminum and the system is at metallurgical equilibrium. The contact thus formed has very high mechanical strength together with excellent heat and electrical conductivity properties.

The differential expansion characteristic between the silicon and the contact is no problem because of the low yield strength of the contact itself. No appreciable electrical gradient is formed between the P-type conductivity material and the contact due, in part, to the highly compatible nature of aluminum metal with P-type materials, i.e. aluminum metal is more P-type (acceptor-like) than are other metals.

It should be noted that many changes in the structures shown in the drawings and described in the specification may be made within the scope of the present invention. For example, while a single ohmic contact is shown, a plurality of ohmic contacts could be adhered to the semiconductor body. Further, while the ohmic contact is shown adhered to the P-type conductivity material, a differently composed contact (such as a layer of antimony and a silver contact) could be adhered to the N-type conductivity material. Accordingly, it is to be understood that the form of the present invention is to be taken as a preferred example of the same and that various changes in the shape, size, material, constitution and arrangement of parts may be resorted to without departing from the spirit of the invention or the scope of the subjoined claims.

What is claimed is:

1. A semiconductor device comprising:

(a) a body of silicon semiconductor material having first and second continguous regions of P-type and N-type conductivity material respectively with a P-N junction therebetween and having opposing surfaces on opposite sides of the junction, (b) an ohmic contact to said P-type region including:

(1) a first deposit of aluminum upon a selected surface portion of said P-type region, said first deposit being free of semiconductor material, (2) a portion only said aluminum alloyed with said P-type region to form a silicon-aluminum eutectic region within said P-type spaced from said P-N junction, and (c) means to prevent further alloying of aluminum into said P-type region at temperatures above the aluminum-silicon eutectic temperature including a second deposit of silver upon and laterally coextensive with said first deposit, said second deposit of silver and said first deposit of aluminum having a lower direct eutectic alloy temperature than the eutectic temperature of said aluminum-silicon eutectic region, and said second deposit of silver comprising a volume of material greater than required to form a direct eutectic alloy with all of said first deposit of aluminum.

2. A semiconductor device comprising:

(a) a body of silicon semiconductor material having first and second contiguous regions of P-type and N-type conductivity material respectively with a P-N junction therebetween and having opposing surfaces on opposite sides of the junction, (b) an ohmic contact to said N-type region including:

(1) a first deposit of antimony upon a selected surface portion of said N-type region, said first deposit being free of semiconductor material, (2) a portion only of said antimony alloyed with said N-type region to form a silicon-antimony eutectic region within said N-type region spaced from said P-N junction, and (c) means to prevent further alloying of antimony into said N-type region at temperatures above the antimony-silicon eutectic temperature including a second deposit of silver upon and laterally coextensive with said first deposit, said second deposit of silver and said first deposit of antimony having a lower direct eutectic alloy temperature than the entertic temperature of said antimony-silicon eutectic region, and said second deposit of silver comprising a volume of material greater than required to form a direct eutectic alloy with all of said first deposit of antimony.

References Cited

UNITED STATES PATENTS

| | | | |
|---|---|---|---|
| 2,840,885 | 7/1958 | Cressell | 29—25.3 |
| 3,190,954 | 6/1965 | Pomerantz | 174—94 |
| 3,209,218 | 9/1965 | Zielasek et al. | 317—240 |
| 3,239,719 | 3/1966 | Shower | 317—101 |
| 3,304,595 | 2/1967 | Sato et al. | 29—2503 |
| 3,239,376 | 3/1966 | Schmidt | 117—212 |
| 2,973,466 | 2/1961 | Atalla et al. | 317—240 |
| 3,007,082 | 10/1961 | Cooper | 317—240 |
| 3,025,589 | 3/1962 | Hoerni | 29—25.3 |
| 3,067,114 | 12/1962 | Tiley et al. | 204—143 |

OTHER REFERENCES

Modern Electroplating, Loewenheim, John Wiley & Sons, 1963, TS 670 E 46, Chapter 14, pp. 326—340.

JOHN W. HUCKERT, Primary Examiner

J. R. SHEWMAKER, Assistant Examiner

U.S. Cl. X.R.

204—15; 29—589